United States Patent [19]

Wakashima

[11] Patent Number: 4,523,371
[45] Date of Patent: Jun. 18, 1985

[54] METHOD OF FABRICATING A RESIN MOLD TYPE SEMICONDUCTOR DEVICE

[76] Inventor: Yoshiaki Wakashima, 1-3-1, Hosoyama, Tama-ku, Kawasaki-shi, Kanagawa, Japan

[21] Appl. No.: 449,874

[22] Filed: Dec. 15, 1982

Related U.S. Application Data

[62] Division of Ser. No. 162,089, Jun. 23, 1980, abandoned.

[30] Foreign Application Priority Data

Aug. 1, 1979 [JP] Japan ................................. 54-97286

[51] Int. Cl.³ ...................... H01L 21/52; H01L 21/56
[52] U.S. Cl. .................................... 29/588; 29/576 S; 29/589; 29/590; 156/309.9; 156/322
[58] Field of Search ...................... 29/588, 576 S, 589, 29/590, 591; 174/52 PE, 52 FP; 357/72, 74; 156/308.4, 309.9, 322; 264/23, 25, 248

[56] References Cited

U.S. PATENT DOCUMENTS

| | | | |
|---|---|---|---|
| 3,610,870 | 10/1971 | Sakamoto | 29/588 X |
| 3,778,685 | 12/1973 | Kennedy | 357/72 |
| 3,793,474 | 2/1974 | Dunn et al. | 174/52 PE |
| 3,947,953 | 5/1976 | Okada et al. | 29/588 |
| 4,305,897 | 12/1981 | Hazama et al. | 264/248 X |

FOREIGN PATENT DOCUMENTS

| | | |
|---|---|---|
| 2618026 | 11/1976 | Fed. Rep. of Germany . |
| 98969 | 8/1976 | Japan . |
| 1165609 | 10/1969 | United Kingdom . |
| 1291956 | 10/1972 | United Kingdom . |
| 1320412 | 6/1973 | United Kingdom . |
| 1329810 | 9/1973 | United Kingdom . |

Primary Examiner—Brian E. Hearn
Assistant Examiner—Alan E. Schiavelli
Attorney, Agent, or Firm—Antonelli, Terry & Wands

[57] ABSTRACT

A resin mold type semiconductor device comprising molded articles for sealing, each consisting of a resin material and having a gap portion thereinside; a semiconductor element positioned in said gap portion inside said molded article for sealing, said semiconductor element having electrodes; electrically conductive leads, each positioned in said gap portion of said molded article for sealing and having one end thereof protruding outwardly from said molded article for sealing; wires, each electrically connecting said electrode of said seminconductor element to said lead; and an insulation material covering at least the surface of said semiconductor element.

11 Claims, 10 Drawing Figures

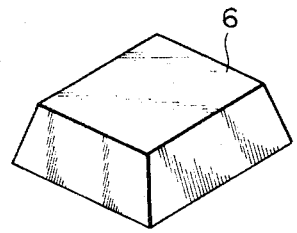
FIG. 5
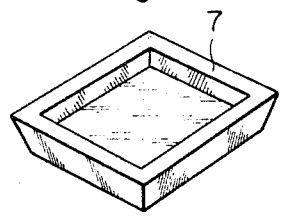
FIG. 6
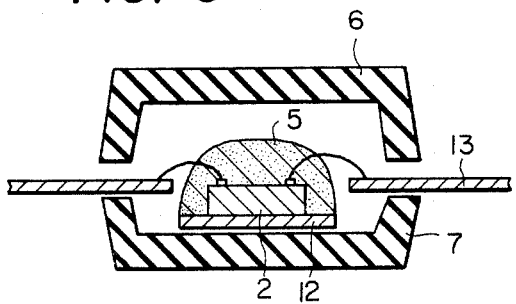
FIG. 7
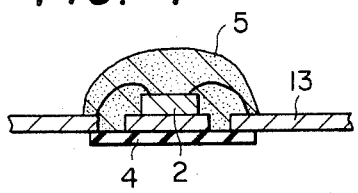
FIG. 8
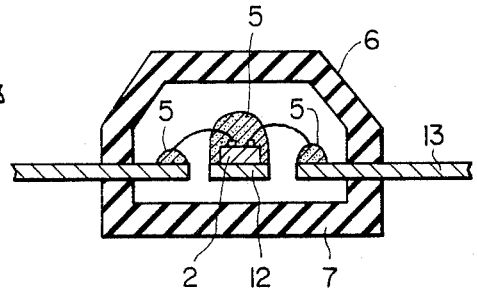

METHOD OF FABRICATING A RESIN MOLD TYPE SEMICONDUCTOR DEVICE

This is a division of application Ser. No. 162,089, filed June 23, 1980, and now abandoned.

BACKGROUND OF THE INVENTION

This invention relates to a resin mold semiconductor device and also to a technique for sealing the same.

In fabricating a semiconductor integrated circuit (hereinafter called an "IC"), a number of IC units are generally fabricated integrally with one another, the integrated article is then molded inside a mold for each IC unit using a resin and after unnecessary portions such as leads are punched out, the resulting molded article is separated into the IC units.

In the resin molding method in the conventional IC fabrication procedures, a transfer molding method using a heat-setting resin such as an epoxy resin or a silicone resin has been widely employed. According to this molding method, a specific molding apparatus equipped at its mold with a runner for charging a molding resin and a dam for preventing outflow of the resin from the mold in necessary. Moreover, since not a short period of time (60 to 180 seconds) is necessary for the resin to be cured, productivity is low. Moreover, because the resin undergoes curing inside the runner, the resin is wasted.

In view of these drawbacks of the resin molding method, the Applicant of this invention previously proposed an invention entitled "Molding method of integrated circuit" as Japanese Patent Application No. 22909/1975 (Japanese Patent Laid-Open No. 98969/1976). The invention disclosed in the prior patent application is characterized by clamping one unit of an IC by upper and lower molded articles that are prepared in advance, and then coupling the molded articles together at the clamp portion. Though this method is suited for mass-production and remarkably reduces the quantity of a necessary resin, it is not free from the drawbacks that the IC main body tends to be broken due to mechanical or thermal impact applied thereto at the time of coupling of the molded articles and the semiconductor element undergoes degradation of its characteristics since the moisture stays in gaps inside the molded articles after their coupling and sealing.

SUMMARY OF THE INVENTION

The present invention contemplates to eliminate the abovementioned problems encountered in the prior art.

It is a first object of the present invention to prevent degradation of the characteristics of the semiconductor element due to the moisture present in gaps inside the molded articles.

It is a second object of the present invention to prevent degradation of the characteristics of the semiconductor element due to heating at the time of sealing the molded articles.

It is a third object of the present invention to prevent degradation of the characteristics of the semiconductor element due to oscillation at the time of sealing the molded articles.

It is a fourth object of the present invention to provide a fabrication method of a resin mold type semiconductor device, which method has improved productivity.

BRIEF DESCRIPTION OF THE DRAWINGS

FIGS. 1 through 4 are schematic views useful for explaining the assembly procedures in accordance with an embodiment of the fabrication method of the resin mold type semiconductor device according to the present invention wherein:

FIG. 1b is a sectional view taken along line A—A' of FIG. 1a;

FIG. 2b is a partial enlarged sectional view of FIG. 2a;

FIGS. 3 and 4 are sectional views each showing the fabrication step;

FIG. 5 is a perspective view showing the shape of the resin molded article; and

FIGS. 6, 7 and 8 are sectional views each showing an embodiment of the resin mold type semiconductor device of the present invention.

DESCRIPTION OF THE PREFERRED EMBODIMENTS

Hereinafter, the present invention will be explained in detail with reference to embodiments thereof.

FIGS. 1 through 4 illustrate the assembly steps of the fabrication method of the resin mold IC in accordance with the present invention.

Figure 1A:
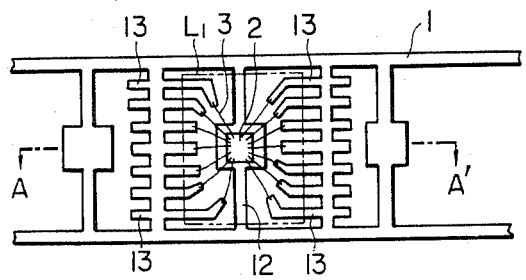
FIG. 1a is a plan view.
Figure 1B:
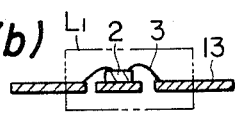

As shown in FIGS. 1a and 1b, an IC chip (semiconductor element) 2 consisting of silicon is bonded to a tab lead 12 of each unit frame of a lead frame 1 consisting of a metal and the electrode of the chip and plural leads 13 are bonded mutually by a wire 3. A frame of dotted line $L_1$ represents the position at which resin molded articles to be described later are located. Incidentally, FIG. 1b is a sectional view taken along line A—A' of FIG. 1a.

Figure 2A:
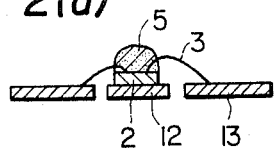
FIG. 2a is a sectional view showing a fabrication step.
Figure 2B:
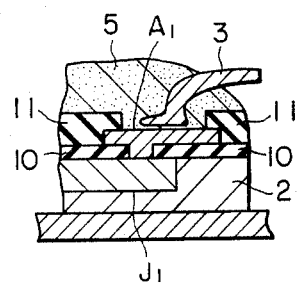

Next, turning to FIGS. 2(a) and 2(b), a viscous soft material is deposited by potting within such a range as to encompass at least an exposed Al electrode of the semiconductor element and the metal wire portion coming into contact with the electrode. In other words, as shown in FIG. 2b, the exposed Al electrode portion (bonding pad portion) $A_1$ and a part of the metal wire 3 are covered with a protective film 5 consisting of a soft insulation material. In FIG. 2b, symbol $J_1$ represents a PN junction, reference numeral 10 represents an $SiO_2$ film and reference numeral 11 represents an insulation film such as phosphor glass or a polyimide type resin film such as polyimideisoindroquinazolindion. Suitable examples of the protective film 5 consisting of a soft material are silicone gel, silicone grease, silicone rubber and the like. Thereafter, treatment is made at a temperature of 100° to 200° C. so that the soft material does not lose it softness or its elasticity but retains the state of the initial potting.

Figure 3:
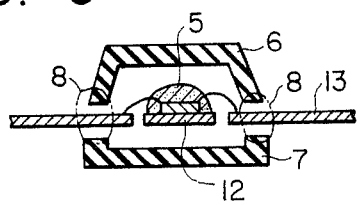
Figure 4:
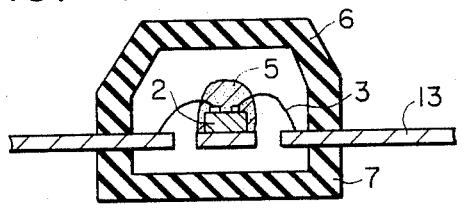

Next, molded articles 6, 7 in the package form consisting of a thermoplastic resin (e.g. polyphenylene sulfide resin) are prepared in advance as shown in FIG. 5 and are then arranged so as to clamp and support one unit of the abovementioned IC chip and lead frame from above and below as shown in FIG. 3. The support portion 8 of the resin molded articles is then heated to the molding temperature of the molded articles, e.g., to about 350° to about 450° C., thereby coupling and sealing the molded resin articles together as shown in FIG. 4. Heating of this support portion is carried out by first pre-heating it to about 200° C. and then applying local heating within a short period of time by ultrasonic electric oscillation, high frequency heating, infrared heating, a hot jet or the like method. Thereafter, the frame portion is cut off from the leads protruding outwardly from the molded articles 6, 7, which are not shown, thereby to obtain the IC device of each unit.

In accordance with the abovementioned embodiment, the objects of the invention can be accomplished for the following reasons.

(1) If a gap is present between the resin molded articles and the elements, the moisture that has entered the resin molded articles from inside or outside the resin molded articles penetrates into the gap to form water droplets, which water droplets in turn cause degradation of the characteristics of the element such as due to corrosion of aluminum. However, in the present invention, since the surface of the Al electrode of the element is covered intimately with the soft material, the water droplets or water films are not allowed to stay on the surface of the electrode of the semiconductor element. It is thus possible to prevent degradation of the characteristics.

(2) The protective film 5 consisting of the soft material has resiliency such as silicone rubber. Accordingly, the mutual contact between the metallic wires, that results from the vibration applied thereto at the time of coupling of the upper and lower resin molded articles, can be prevented by the resiliency of this soft covering material. When heating is made at the time of coupling of the molded articles, the degradation of the characteristics of the element due to the heat change can be prevented by this soft covering material. For these reasons, not only a part but also the entire portion of the metallic wire may be covered with this soft material as shown in FIG. 7. It is by no means difficult to cover the entire portion of the metallic wire with this soft material.

(3) The molded article package of this thermoplastic resin makes it possible to reduce the installation cost as well as the installation space to below ½ in comparison with the conventional transfer mold. This also makes it easy to automate the assembly procedures, thereby drastically improving productivity.

(4) In accordance with the present invention, selection of suitable resin materials for the soft material and for the molded articles provides a counter-measure for the erroneous operation of the IC memory or the like, that would otherwise occur due to α rays, that has been the critical problem with the conventional ceramic package.

It is to be noted that the present invention is in no way restricted to the abovementioned embodiment.

FIG. 6 shows an embodiment of a resin mold type semiconductor device in which after the pellet-fitting portion (tab portion 12) of the lead frame 1 is bent in advance, the surface of the IC chip 2 is covered with the protective film 5 of the soft material and the upper molded article is put on and coupled with the lower molded article in such a manner as to clamp and support the lead frame while the lower surface of the tab portion 12 is brought into contact with the bottom of the lower molded article. According to this structure, it is possible to make effective use of the gap portion of the lower resin molded article and to form a thin resin molded semiconductor device. As to the relationship of position between the lead surface, to which the metallic wire is to be connected, and the electrode surface of the semiconductor element, the electrode surface is positioned on the same plane as, or below, the electrode surface. For this reason, the wire is prevented from coming into contact with the corners of the element, thus making it possible to prevent breakage of the wire.

FIG. 7 shows another embodiment in which, in covering the surface of the semiconductor element with the protective film of the soft material, an insulation tape 4 or sheet having an adhesive applied on the lower surface of the lead frame is employed. This tape 4 prevents outflow of the protective film and restricts its expansion in the transverse direction. Thus, the protection film can be used highly efficiently and its effect can be enhanced.

FIG. 8 shows still another embodiment in which the tip of the lead 13, to which the surface of the semiconductor element and the wire are connected in the present invention, is covered with the protective film 5. When the molded articles are sealed by oscillation heating such as ultrasonic oscillation, this embodiment prevents the wire connected to the lead from being cut by the abovementioned oscillation. As the material for the protective film 5, a polyimide type resin (e.g., polyimide isoindroquinazolinedion) may be used. Since the polyimide type resin has higher heat resistance than the silicone type resin, it is possible to sufficiently preclude the thermal influence, caused by heating at the time of sealing the molded articles 6, 7, upon the semiconductor element. Furthermore, the polyimide type resin has the effect of preventing the erroneous operation of the element due to the α rays.

The molded articles 6, 7 may consist of a heat-setting resin. In such a case, it is advisable to employ an adhesive such as an epoxy resin type for the bonding portion.

As the lead frame for the connection of the semiconductor element, a lead frame not having a dam may also be used.

LIST OF THE PRIOR ART

Japanese Patent Laid-Open No. 98,969/1976 laid-open on Aug. 31, 1976.

What is claimed is:

1. A fabrication method of a semiconductor device comprising the steps of:
   preparing a lead frame having a central pad and leads surrounding said central pad;
   securing a semiconductor element on said central pad and electrically connecting said semiconductor element to said leads by means of metallic wires;
   preparing molded upper and lower sealing articles of a thermoplastic resin material, said molded upper and lower sealing articles each having a bottom portion and a wall portion standing at the periphery of said bottom portion;
   locating said molded upper and lower sealing articles opposite to each other in relation to said lead frame so as to interpose said lead frame therebetween and to cover said semiconductor element and said metallic wires;
   preheating said molded upper and lower sealing articles to a first temperature; and
   sealing said molded upper and lower sealing articles by heating the resin material of said wall portions thereof to a second temperature higher than said first temperature.

2. The fabrication method of a semiconductor device as defined in claim 1, wherein the heating in said sealing step is carried out by means of ultrasonic electric oscillation.

3. The fabrication method of a semiconductor device as defined in claim 2, further comprising the steps of applying a coating of a resin material over said semiconductor element and at least parts of said metallic wires.

4. The fabrication method of a semiconductor device as defined in claim 1, wherein the heating in said sealing step is carried out by means of either one of infrared heating and hot jet.

5. The fabrication method of a semiconductor device as defined in claim 4, wherein said preheating is carried out by means of either one of infrared heating and hot jet.

6. The fabrication method of a semiconductor device as defined in claim 1, wherein said thermoplastic resin material is polyphenylene sulfide.

7. The fabrication method of a semiconductor device as defined in claim 1, wherein said first temperature is about 200° C.

8. The fabrication method of a semiconductor device as defined in claim 7, wherein said second temperature is the molding temperature of the molded upper and lower articles.

9. The fabrication method of a semiconductor device as defined in claim 7, wherein said second temperature is 350°–450° C.

10. The fabrication method of a semiconductor device as defined in claim 9, wherein sealing the molded upper and lower sealing articles is carried out by localized heating of the wall portions.

11. In a method of fabricating a resin mold type semiconductor device having a semiconductor element positioned on a central pad of a lead frame, with leads surrounding said central pad, and wires extending from said semiconductor element to said leads, and with upper and lower sealing articles positioned and coupled in relation to said lead frame so as to interpose said lead frame therebetween and to cover said semiconductor element and said metallic wires, a method of helping prevent disconnection of said leads from said semiconductor element during coupling of said upper and lower sealing articles when said upper and lower sealing articles are made of a thermoplastic resin material, comprising applying a coating of a resin material over at least the connections of said semiconductor element with the wires after said semiconductor element has been positioned on said central pad and wires have been connected from said semiconductor element to said leads; positioning the upper and lower sealing articles of a thermoplastic resin material such that they interpose the lead frame and cover the semiconductor element and the metallic wires; and sealing the upper and lower sealing articles to each other by heating the thermoplastic resin material of the upper and lower sealing articles at support positions thereof, whereby the applied coating helps prevent disconnection of the semiconductor element from the leads during coupling of the upper and lower sealing articles to each other and wherein the upper and lower sealing articles are sealed by initially preheating the support portions of the upper and lower sealing articles to a first temperature and then heating said support portions to a second temperature higher than said first temperature.

* * * * *